(12) United States Patent
Elftmann et al.

(10) Patent No.: US 6,838,902 B1
(45) Date of Patent: Jan. 4, 2005

(54) SYNCHRONOUS FIRST-IN/FIRST-OUT BLOCK MEMORY FOR A FIELD PROGRAMMABLE GATE ARRAY

(75) Inventors: Daniel Elftmann, Livermore, CA (US); Theodore Speers, San Jose, CA (US); Arunangshu Kundu, San Jose, CA (US)

(73) Assignee: Actel Corporation, Mountain VIew, CA (US)

( * ) Notice: Subject to any disclaimer, the term of this patent is extended or adjusted under 35 U.S.C. 154(b) by 0 days.

(21) Appl. No.: 10/448,259

(22) Filed: May 28, 2003

(51) Int. Cl.[7] ............................................. H03K 19/177
(52) U.S. Cl. ...................... 326/40; 326/41; 365/230.03; 365/189.01; 365/63; 365/233
(58) Field of Search ........................ 326/38–41; 365/63, 365/189.01, 189.02, 189.05, 189.07, 191, 203, 233, 230.03

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 371/20 |
| 4,638,187 A | 1/1987 | Boler et al. | 307/451 |
| 4,638,243 A | 1/1987 | Chan | 324/51 |
| 4,684,830 A | 8/1987 | Tsui et al. | 307/465 |
| 4,700,130 A | 10/1987 | Bloemen | 324/110 |
| 4,706,216 A | 11/1987 | Carter | 365/94 |
| 4,713,557 A | 12/1987 | Carter | 307/242 |
| 4,717,912 A | 1/1988 | Harvey et al. | 340/825.83 |
| 4,718,042 A | 1/1988 | Moll et al. | 365/201 |
| 4,742,252 A | 5/1988 | Agrawal | 307/465 |
| 4,772,812 A | 9/1988 | Desmarais | 307/473 |
| 4,800,176 A | 1/1989 | Kakumu et al. | 437/193 |
| 4,857,774 A | 8/1989 | El-Ayat et al. | 307/465 |
| 4,870,300 A | 9/1989 | Nakaya et al. | 307/303 |
| 4,870,302 A | 9/1989 | Freeman | 307/465 |
| 4,873,459 A | 10/1989 | El Gamal et al. | 307/465 |
| 4,928,023 A | 5/1990 | Marshall | 307/443 |
| 4,930,097 A | 5/1990 | Ledenbach et al. | 364/716 |
| 4,935,645 A | 6/1990 | Lee | 307/362 |

(List continued on next page.)

FOREIGN PATENT DOCUMENTS

| | | | |
|---|---|---|---|
| EP | 0 415 542 A2 | 3/1991 | H03K/19/173 |
| EP | 0 415 542 A3 | 10/1991 | H03K/19/173 |
| EP | 0 889 593 A1 | 1/1999 | H03K/19/173 |
| EP | 1 137 188 A2 | 9/2001 | H03L/7/08 |

OTHER PUBLICATIONS

L. Ashby, "ASIC Clock Distribution using a Phase Locked Loop (PLL)", *Proceedings Fourth Annual IEEE International ASIC Conference and Exhibit*, pp. 6.1–6.3, Sep. 1991.
"AV9170 Clock Synchronizer and Multiplier", pp. 1–4, Nov. 1992.
"AV9170 Application Note", AvaSem, pp. 1–7, Jan. 1993.
U. Ko, "A 30–ps JITTER, 3.6µs Locking, 3.3–Volt Digital PLL for CMOS Gate Arrays", *IEEE 1993 Custom Integrated Circuits Conference*, pp. 23.3.1–23.3.4, Conf. Date: May 9–12, 1993.

(List continued on next page.)

*Primary Examiner*—Vibol Tan
(74) *Attorney, Agent, or Firm*—Sierra Patent Group, Ltd.

(57) ABSTRACT

The present invention comprises a field programmable gate array that has a plurality of dedicated first-in/first-out memory logic components. The field programmable gate array includes a plurality of synchronous random access memory blocks that are coupled to a plurality of dedicated first-in/first-out memory logic components and a plurality of random access memory clusters that are programmably coupled to the plurality of dedicated first-in/first-out memory logic components and to the plurality of synchronous random access memory blocks.

6 Claims, 6 Drawing Sheets

U.S. PATENT DOCUMENTS

| | | | | |
|---|---|---|---|---|
| 4,959,561 | A | 9/1990 | McDermott et al. | 307/443 |
| 4,978,905 | A | 12/1990 | Hoff et al. | 323/314 |
| 5,008,855 | A | 4/1991 | Eltoukhy et al. | 365/96 |
| 5,046,035 | A | 9/1991 | Jigour et al. | 364/716 |
| 5,083,083 | A | 1/1992 | El-Ayat et al. | 324/158 R |
| 5,121,394 | A | 6/1992 | Russell | 371/22.1 |
| 5,122,685 | A | 6/1992 | Chan et al. | 307/465.1 |
| 5,126,282 | A | 6/1992 | Chiang et al. | 437/172 |
| 5,132,571 | A | 7/1992 | McCollum et al. | 307/465.1 |
| 5,144,166 | A | 9/1992 | Camarota et al. | 307/465.1 |
| 5,187,392 | A | 2/1993 | Allen | 307/465 |
| 5,198,705 | A | 3/1993 | Galbraith et al. | 307/465 |
| 5,208,491 | A | 5/1993 | Ebeling et al. | 307/465 |
| 5,220,213 | A | 6/1993 | Chan et al. | 307/465 |
| 5,220,215 | A | 6/1993 | Douglas et al. | 307/465 |
| 5,221,865 | A | 6/1993 | Phillips et al. | 307/465 |
| 5,222,066 | A | 6/1993 | Grula et al. | 371/21.1 |
| 5,258,319 | A | 11/1993 | Inuishi et al. | 437/35 |
| 5,272,388 | A | 12/1993 | Bakker | 307/202.1 |
| 5,293,133 | A | 3/1994 | Birkner et al. | 324/713 |
| 5,300,830 | A | 4/1994 | Hawes | 307/465 |
| 5,300,832 | A | 4/1994 | Rogers | 307/475 |
| 5,317,698 | A | 5/1994 | Chan | 395/325 |
| 5,365,485 | A | 11/1994 | Ward et al. | 365/221 |
| 5,367,207 | A | 11/1994 | Goetting et al. | 307/465 |
| 5,375,089 | A | 12/1994 | Lo | 365/189.04 |
| 5,394,033 | A | 2/1995 | Tsui et al. | 326/41 |
| 5,394,034 | A | 2/1995 | Becker et al. | 326/39 |
| 5,396,128 | A | 3/1995 | Dunning et al. | 326/68 |
| 5,397,939 | A | 3/1995 | Gordon et al. | 326/38 |
| 5,399,920 | A | 3/1995 | Van Tran | 326/83 |
| 5,400,262 | A | 3/1995 | Mohsen | 364/489 |
| 5,430,335 | A | 7/1995 | Tanoi | 327/170 |
| 5,430,687 | A | 7/1995 | Hung et al. | 365/230.08 |
| 5,469,003 | A | 11/1995 | Kean | 326/39 |
| 5,469,396 | A | 11/1995 | Eltoukhy | 365/210 |
| 5,473,268 | A | 12/1995 | Declercq et al. | 326/80 |
| 5,485,103 | A | 1/1996 | Pedersen et al. | 326/41 |
| 5,486,775 | A | 1/1996 | Veenstra | 126/38 |
| 5,526,312 | A | 6/1996 | Eltoukhy | 365/201 |
| 5,537,057 | A | 7/1996 | Leong et al. | 326/41 |
| 5,546,019 | A | 8/1996 | Liao | 326/81 |
| 5,559,464 | A | 9/1996 | Orii et al. | 327/333 |
| 5,572,476 | A | 11/1996 | Eltoukhy | 365/210 |
| 5,602,780 | A | * 2/1997 | Diem et al. | 365/189.01 |
| 5,666,322 | A | 9/1997 | Conkle | 365/233 |
| 5,670,905 | A | 9/1997 | Keeth et al. | 327/333 |
| 5,744,979 | A | 4/1998 | Goetting | 326/39 |
| 5,744,980 | A | * 4/1998 | McGowan et al. | 326/40 |
| 5,801,547 | A | 9/1998 | Kean | 326/40 |
| 5,809,281 | A | 9/1998 | Steele et al. | 395/497.01 |
| 5,815,003 | A | 9/1998 | Pedersen | 326/39 |
| 5,815,004 | A | 9/1998 | Trimberger et al. | 326/41 |
| 5,821,776 | A | 10/1998 | McGowan | 326/41 |
| 5,825,200 | A | 10/1998 | Kolze | 326/38 |
| 5,825,201 | A | 10/1998 | Kolze | 326/39 |
| 5,825,202 | A | 10/1998 | Tavana et al. | 326/39 |
| 5,825,662 | A | 10/1998 | Trimberger | 364/491 |
| 5,828,230 | A | 10/1998 | Young | 326/41 |
| 5,828,538 | A | 10/1998 | Apland et al. | 361/56 |
| 5,831,448 | A | 11/1998 | Kean | 326/41 |
| 5,832,892 | A | 11/1998 | Yaoita | 123/260 |
| 5,835,165 | A | 11/1998 | Keate et al. | 348/845.1 |
| 5,835,998 | A | 11/1998 | Pedersen | 326/40 |
| 5,838,167 | A | 11/1998 | Erickson et al. | 326/38 |
| 5,838,584 | A | 11/1998 | Kazarian | 364/491 |
| 5,838,954 | A | 11/1998 | Trimberger | 395/500 |
| 5,847,441 | A | 12/1998 | Cutter et al. | 257/530 |
| 5,847,577 | A | 12/1998 | Trimberger | 326/38 |
| 5,848,005 | A | 12/1998 | Cliff et al. | 365/230.03 |
| 5,848,006 | A | 12/1998 | Nagata | 365/230.06 |
| 5,850,151 | A | 12/1998 | Cliff et al. | 326/39 |
| 5,850,152 | A | 12/1998 | Cliff et al. | 326/40 |
| 5,850,564 | A | 12/1998 | Ting et al. | 395/800.37 |
| 5,852,608 | A | 12/1998 | Csoppenszky et al. | 370/465 |
| 5,854,763 | A | 12/1998 | Gillingham et al. | 365/189.04 |
| 5,859,542 | A | 1/1999 | Pedersen | 326/39 |
| 5,859,543 | A | 1/1999 | Kolze | 326/41 |
| 5,859,544 | A | 1/1999 | Norman | 326/40 |
| 5,861,761 | A | 1/1999 | Kean | 326/41 |
| 5,869,981 | A | 2/1999 | Agrawal et al. | 326/39 |
| 5,870,586 | A | 2/1999 | Baxter | 395/500 |
| 5,880,492 | A | 3/1999 | Duong et al. | 257/209 |
| 5,880,512 | A | 3/1999 | Gordon et al. | 257/530 |
| 5,880,597 | A | 3/1999 | Lee | 326/41 |
| 5,880,598 | A | 3/1999 | Duong | 326/41 |
| 5,883,526 | A | 3/1999 | Reddy et al. | 326/41 |
| 5,883,850 | A | 3/1999 | Lee et al. | 365/230.03 |
| 5,949,719 | A | 9/1999 | Clinton et al. | 365/189.01 |
| 5,952,847 | A | 9/1999 | Plants et al. | 326/80 |
| 5,994,934 | A | 11/1999 | Yoshimura et al. | 327/158 |
| 6,011,744 | A | 1/2000 | Sample et al. | 365/230.03 |
| 6,034,677 | A | 3/2000 | Noguchi et al. | 345/327 |
| 6,038,627 | A | 3/2000 | Plants | 710/126 |
| 6,049,487 | A | 4/2000 | Plants et al. | 365/189.04 |
| 6,111,448 | A | 8/2000 | Shibayama | 327/293 |
| 6,181,174 | B1 | 1/2001 | Fujieda et al. | 327/158 |
| 6,191,996 | B1 | * 2/2001 | Yamamoto | 365/230.03 |
| 6,289,068 | B1 | 9/2001 | Hassoun et al. | 375/376 |
| 6,292,016 | B1 | 9/2001 | Jefferson et al. | 326/39 |
| 6,329,839 | B1 | 12/2001 | Pani et al. | 326/41 |
| 6,430,088 | B1 | 8/2002 | Plants et al. | 365/189.04 |
| 6,437,650 | B1 | 8/2002 | Sung et al. | 331/25 |
| 6,496,887 | B1 | 12/2002 | Plants | 710/100 |

OTHER PUBLICATIONS

A. Efendovich et al., "Multi-Frequency Zero-Jitter Delay-Locked Loop", *IEEE 1993 Custom Integrated Circuits Conference*, pp. 27.1.1–27.1.4, Conf. Date: May 9–12, 1993.

R. Quinnell, "Blending gate arrays with dedicated circuits sweetens ASIC development", EDN, pp. 29–32, Mar. 31, 1994.

J. Chen, "PLL-based clock systems span the system spectrum from green PCs to Alpha", EDN, pp. 147–148, 150, 152, 154–155, Nov. 9, 1995.

P. Sevalia, "Straightforward techniques cut jitter in PLL-based clock drivers", EDN, pp. 119–123, 125, Nov. 23, 1995.

D. Bursky, "Memories Hit New Highs And Clocks Run Jitter-Free", Electronic Design, pp. 79–80, 84–85, 89–93, Feb. 19, 1996.

"3200DX Dual-Port Random Access Memory (RAM)", Actel Corp. Application Note, pp. 5–67—5–68, Sep. 1997.

"APEX 20KC Programmable Logic Device Data Sheet", Altera Corp. Version 2.1, DS-APEX20KC-2.1, pp. 1–87, Apr. 2002.

"APEX II Programmable Logic Device Family Data Sheet", Altera Corp. Version 3.0, DS-APEXII-3.0, pp. 1–99, Aug., 2002.

* cited by examiner

SYNCHRONOUS FIRST-IN/FIRST-OUT BLOCK MEMORY FOR A FIELD PROGRAMMABLE GATE ARRAY

BACKGROUND OF THE SYSTEM

1. Field of the System

The present system relates to field programmable gate array (FPGA) devices. More specifically, the system relates to a synchronous first-in/first out memory module for an FPGA.

2. Background

FPGAs are known in the art. An FPGA comprises any number of logic modules, an interconnect routing architecture and programmable elements that may be programmed to selectively interconnect the logic modules to one another and to define the functions of the logic modules. To implement a particular circuit function, the circuit is mapped into the array and the appropriate programmable elements are programmed to implement the necessary wiring connections that form the user circuit.

An FPGA core tile may be employed as a stand-alone FPGA, repeated in a rectangular array of core tiles, or included with other functions in a system-on-a-chip (SOC). The core FPGA tile may include an array of logic modules, and input/output modules. An FPGA circuit may also include other components such as static random access memory (SRAM) blocks. Horizontal and vertical routing channels provide interconnections between the various components within an FPGA core tile. Programmable connections are provided by programmable elements between the routing resources.

An FPGA circuit can be programmed to implement virtually any set of digital functions. Input signals are processed by the programmed circuit to produce the desired set of outputs. Such inputs flow from the user's system, through input buffers and through the circuit, and finally back out to the user's system via output buffers. The bonding pad, input buffer and output buffer combination is referred to as an input/output port (I/O). Such buffers provide any or all of the following input/output (I/O) functions: voltage gain, current gain, level translation, delay, signal isolation or hysteresis.

As stated above, many FPGA designers incorporate blocks of SRAM into their architecture. In some applications, the SRAM blocks are configured to function as a first-in/first-out (FIFO) memory. A FIFO is basically a SRAM memory with automatic read and write address generation and some additional control logic. The logic needed to implement a FIFO, in addition to the SRAM blocks, consists of address generating logic and flag generating logic.

Counters are used for address generation. Two separate counters are used in this application for independent read and write operations. By definition, a counter circuit produces a deterministic sequence of unique states. The sequence of states generated by a counter is circular such that after the last state has been reached the sequence repeats starting at the first state. The circular characteristic of a counter is utilized to generate the SRAM's write and read addresses so that data is sequenced as the first data written to the SRAM is the first data read. The size of the sequence produced by the counters is matched to the SRAM address space size. Assuming no read operation, when the write counter sequence has reached the last count, the SRAM has data written to all its addresses. Without additional control logic, further write operations would overwrite existing data starting at the first address.

Additional logic is needed to control the circular sequence of the read and write address counters in order to implement a FIFO. The control logic enables and disables the counters when appropriate and generates status flags. The read and write counters are initialized to produce a common start location. The control logic inhibits reading at any location until a write operation has been performed. When the write counter pulls ahead of the read counter by the entire length of the address space, the SRAM has data written to all its addresses. The control logic inhibits overwriting an address until its data has been read. Once the data has been read, the control permits overwriting at that address. When the read counter catches up to the write counter, the SRAM no longer contains valid data and the control logic inhibits reading until a write operation is performed.

Output signals, known to those of ordinary skill in the art as flags, provide the system with status on the SRAM capacity available. The full and empty conditions are indicated through full and empty flags. Two additional flags are generated to warn of approaching empty or full conditions.

FPGAs have programmable logic to implement this control logic. With the availability of a SRAM block, an FPGA application may be configured to operate as a FIFO memory. Many prior art FPGAs use this approach. However, considerable FPGA gates are consumed when implementing the control logic for a FIFO in this manner and this increases the cost of the application. Also, the performance of the FIFO is likely to be limited by the speed of the control logic and not the SRAM.

Hence, there is a need for an FPGA that has dedicated logic specifically included to implement a FIFO. The FIFO logic may included among the SRAM components in an FPGA core tile. The result is improved performance and a decrease in silicon area needed to implement the functions with respect to implementing the FIFO-function with FPGA gates.

SUMMARY OF THE SYSTEM

A field programmable gate array having a plurality of random access memory blocks coupled to a plurality of dedicated first-in/first-out memory logic components and a plurality of random access memory clusters programmably coupled to the rest of the FPGA is described.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

In the present disclosure, Vcc is used to define the positive power supply for the digital circuit as designed. As one of ordinary skill in the art will readily recognize, the size of a digital circuit may vary greatly depending on a user's particular circuit requirements. Thus, Vcc may change depending on the size of the circuit elements used.

Moreover, in this disclosure, various circuits and logical functions are described. It is to be understood that designations such as "1" and or "0" in these descriptions are arbitrary logical designations. In a first implementation of the invention, or "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

Figure 1:
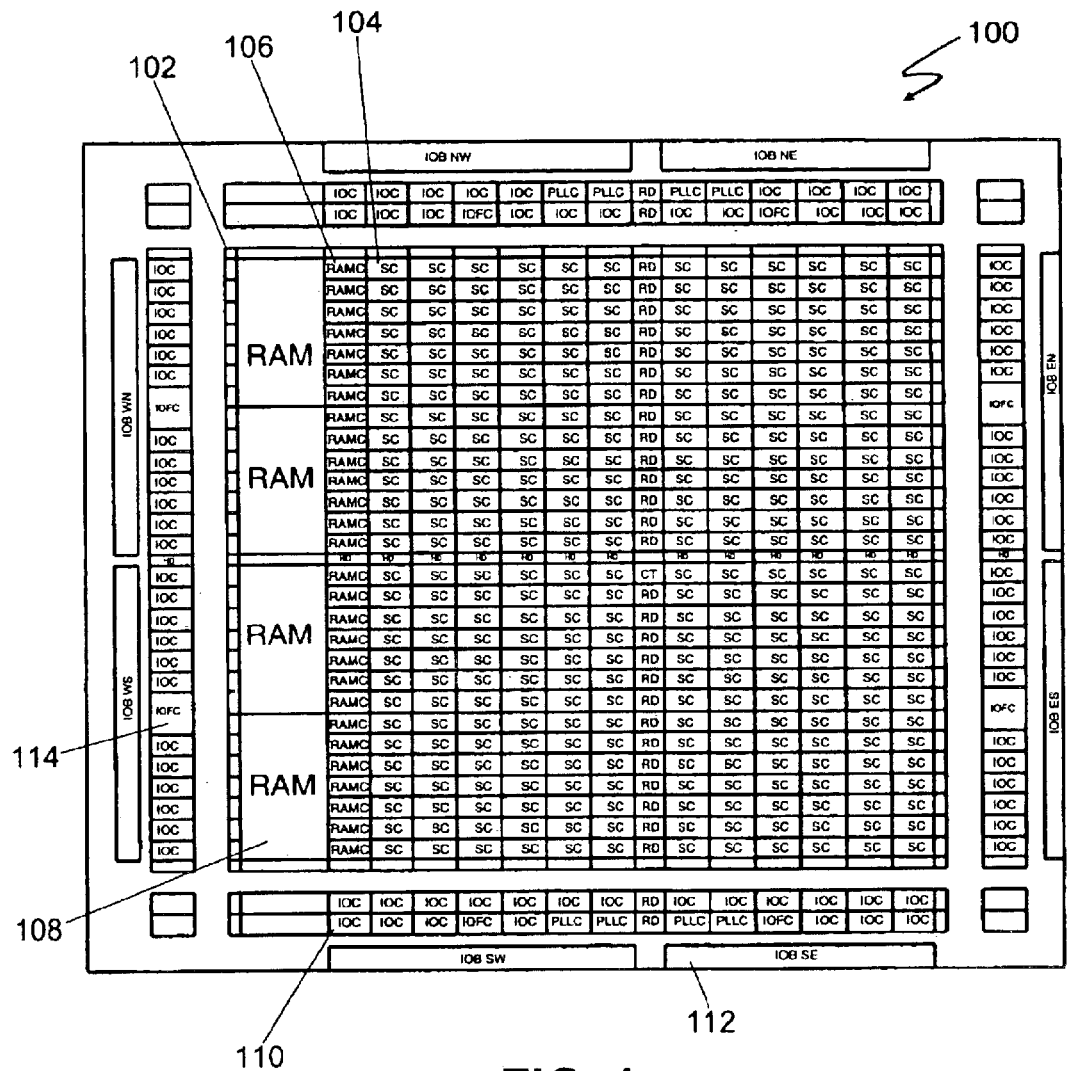
FIG. 1 is a block diagram of a one-tile FPGA of the present system.

FIG. 1 is a block diagram of an illustrative core tile 102 in an FPGA 100 of the present system. FPGA core tile 102 comprises an array of logic clusters 104, static random access memory (SRAM) clusters 106 and static random access memory (SRAM) modules 108. Logic clusters 104 and SRAM clusters 106 are connected together by a routing interconnect architecture (not shown) that may comprise multiple levels of routing interconnects. FPGA core tile 102 is surrounded by input/output (110) clusters 110, input/ output (I/O) FIFO control blocks 114 and input/output banks 112. There are two rows of I/O clusters 110 on the top and bottom edges of FPGA 100 and one column of I/O clusters on the left and right edge of FPGA 100. In the present example, for illustrative purposes only, there are seven SRAM clusters 106 adjacent to and interacting with each SRAM module 108.

Figure 2:
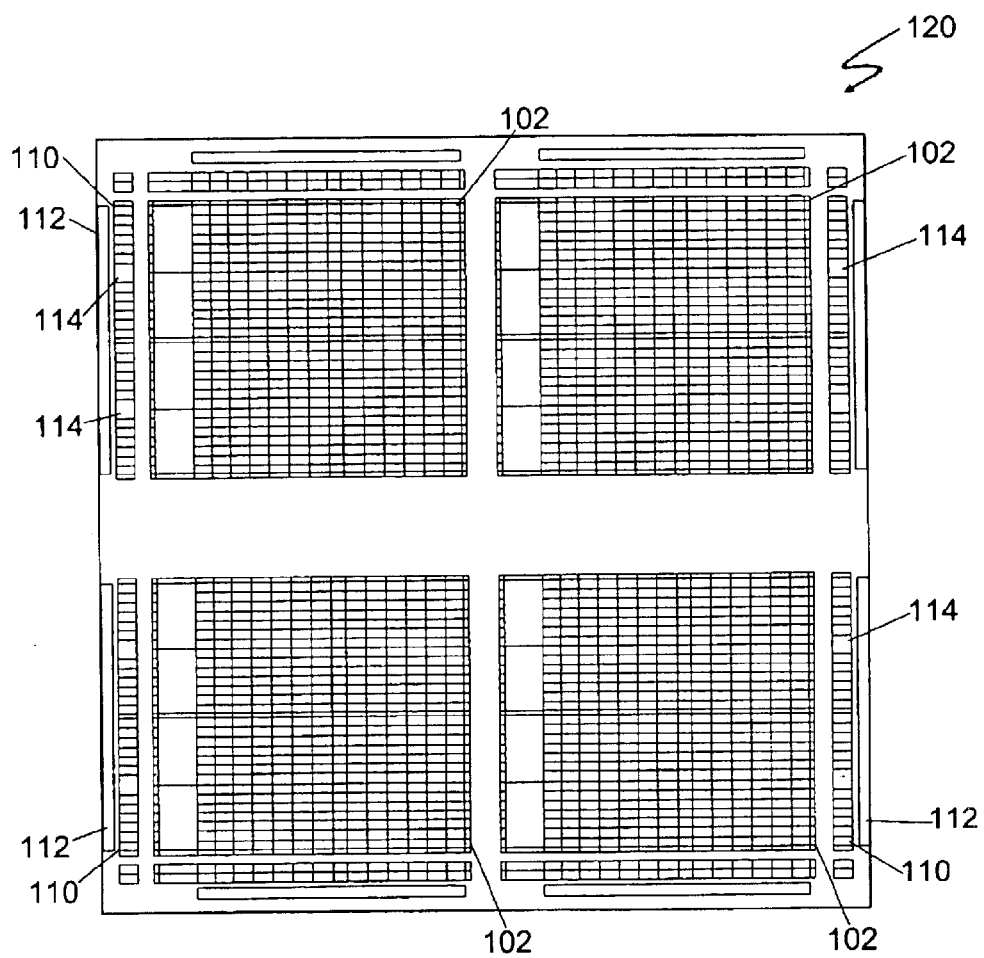
FIG. 2 is a block diagram of an FPGA including multiple core tiles 102 as shown in FIG. 1.

FIG. 2 is a block diagram of an illustrative FPGA including multiple core tiles 102 as shown as an example in FIG. 1. As shown in FIG. 2, FPGA 120 comprises four core tiles 102, though other numbers of tiles are possible. Core tiles 102 are surrounded by 110 clusters 110, input/output FIFO control blocks 114 and I/O banks 112.

Figure 3:
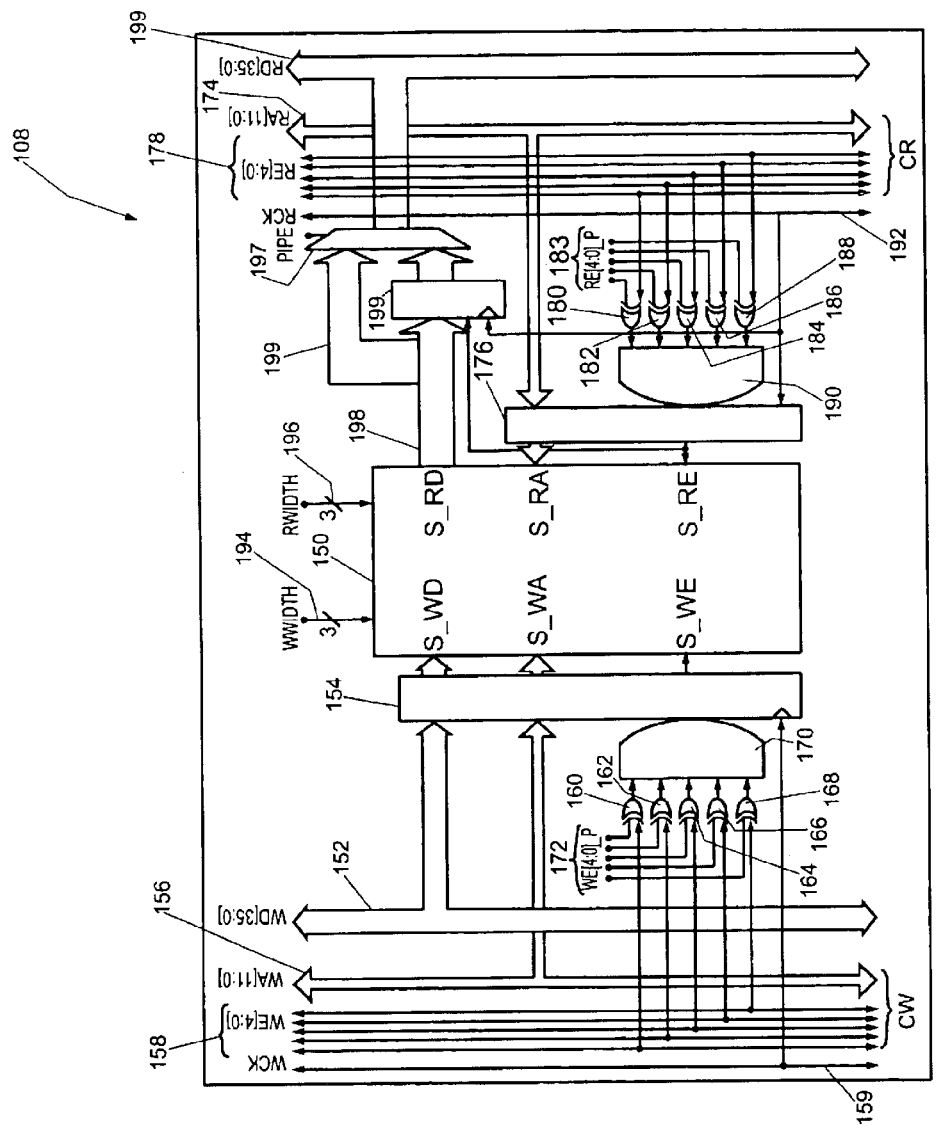
FIG. 3 is a simplified block diagram of a synchronous random access memory (SRAM) module of the present system.

FIG. 3 is a simplified block diagram of a static random access memory (SRAM) block 108 of the present system. The present system combines dedicated control logic with a two port SRAM to produce a FIFO. As set forth in FIGS. 1 and 2, there are four SRAM blocks 108 along the one side of FPGA tile 102. Each SRAM block 108 may be configured to operate as an individual SRAM module or modules may be cascaded together to produce wider or deeper memory combinations. As set forth in greater detail below, dedicated FIFO control logic has been added to each SRAM block.

Referring still to FIG. 3, SRAM block 108 comprises a SRAM component 150. SRAM component 150 is a memory component. Memory components are well known to those of ordinary skill in the relevant art and can vary greatly depending on the application. Write data bus 152 and write address bus 156 are coupled to SRAM component 150 through register 154. Write data enable signal lines 158 are each coupled to SRAM component 150 through one input of two-input XOR gates 160, 162, 164, 166, 168, AND gate 170 and register 154. The second input of two-input XNOR gates 160, 162, 164, 166, 168 is provided by write enable control lines 172. Register 154 receives a clock signal through write clock signal line 159. Read address bus 174 is coupled to SRAM component through register 176. Read enable signal lines 178 are each coupled to SRAM component 150 through one input of XOR gates 180, 182, 184, 186, 188, AND gate 190 and register 176. The second input of register 176 receives a clock signal through read clock signal line 192. Input signal busses 194 and 196 provide the signals for determining the write word width and read word width respectively. Read data bus 198 is coupled to the output of SRAM component 150 through register 199 and two-input multiplexer 197.

In the present example, for illustrative purposes only, SRAM block 108 has multiple bits accessible by two independent ports: a read only port (all circuitry on the right of SRAM block 108) and a write only port (all circuitry on the left of SRAM block 108). Both ports may be independently configured in multiple words by bits per words combinations. For example, both ports may be configured as 4,096×1, 2,048×2, 1,024×4, 512×9, 256×18 and 128×36. In addition, a plurality of SRAM blocks may be cascaded together by means of busses 152, 156, 158, 174, 178, 198. In the present example, there are five enable lines for each port, one for real enable and four for higher order address bits. The ten XOR gates are used to invert or not invert the lines on a block-by-block basis effectively making AND gates 170 and 190 decoders with programmable bubbles on the inputs. The write port is synchronous to the write clock and the read port is synchronous to the read clock. As one of ordinary skill in the art would readily recognize, the above example is illustrative only, many other configurations or memory blocks could be used.

Figure 4:
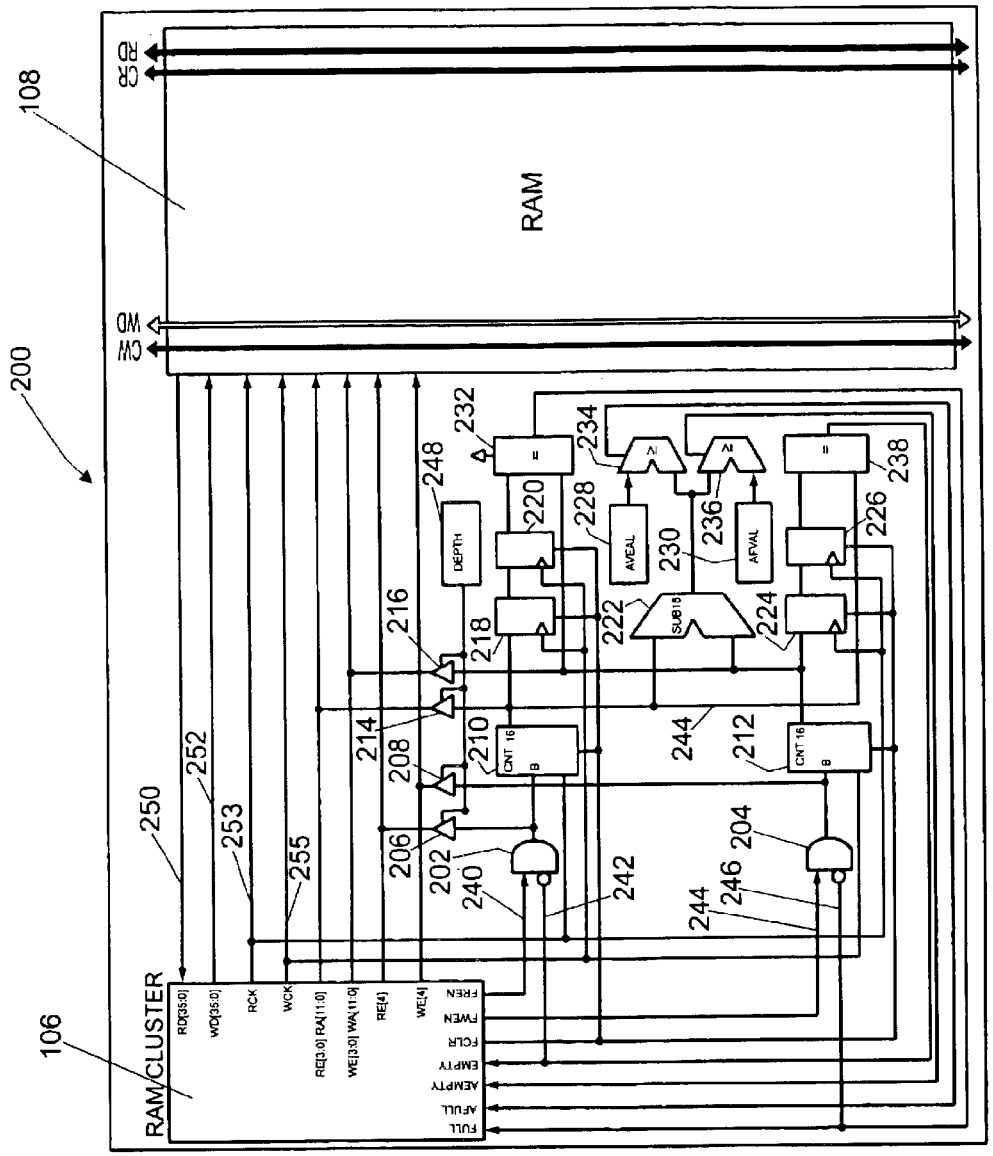
FIG. 4 is a simplified schematic diagram illustrating the FIFO logic component of the present system.

FIG. 4 is a simplified schematic diagram illustrating the FIFO logic component 200 of the present invention. FIFO logic component 200 is coupled between static random access memory (SRAM) clusters 106 and static random access memory (SRAM) block 108. In the present example, for illustrative purposes only, FIFO logic component 200 is coupled between seven static random access memory (SRAM) clusters 106 and static random access memory (SRAM) block 108. Two input AND gate 202 has its non-inverting and inverting inputs coupled to random access memory cluster 106 via signal lines 240 and 242 respectively and an output coupled to address comparator 238, and to subtractor circuit 222 through counter 210 and to address comparator 232 through registers 218 and 220. The output of two-input AND gate 202 may also be coupled to RAM module 108 through tri-state buffer 206. The output of counter 210 may also be coupled to SRAM block 108 through tri-state buffer 214. Two input AND gate 204 has its non-inverting and inverting inputs coupled to SRAM cluster 106 through signal lines 244 and 246 respectively and its output coupled to address comparator 232 through counter 212. Two input AND gate 204 also has its output coupled to address comparator 238 through counter 212, register 224 and register 226 and its output is also coupled to subtracter 222 through counter 212. The output of two-input AND gate 204 may also be coupled to SRAM module 108 through tri-state buffer 208. The output of counter 212 may also be coupled to SRAM block 108 through tri-state buffer 216.

Buffers 206, 208, 214 and 216 receive their control signals from SRAM clusters 106 programmable configuration bits 248.

Referring still to FIG. 4, subtractor circuit 222 has its output coupled to one input of magnitude comparators 234 and 236. Magnitude comparators 234 and 236 receive their second input from the programmable configuration bits 228 and 230 respectively. The configuration bits in 228 and 230 are programmable threshold values need to generate the almost full and almost empty flags respectively.

Read data bus 250 and write data bus 252 are coupled directly to SRAM block 108. When the FIFO logic component is not active, controller bits 248 are set at 0 disabling the tri-state buffers 206, 208 214 and 216. When the SRAM is not configured as a FIFO, all input signals originate from adjacent SRAM clusters 106. When a SRAM is configured as a FIFO, a select set of signals from the RAM cluster modules are set to high impedance and FIFO logic component 200 seizes control of the signal lines. When FIFO logic component 200 is active, it seizes control of the write enable signals 158, the read enable signals 178 and the read and write address lines 174 and 156 respectively as shown in FIG. 3.

Counters 210 and 212 are binary counters, however, they also generate gray code. Gray code or "single distance code" is an ordering of $2^n$ binary numbers such that only one bit changes between any two consecutive elements. The binary value is sent to subtractor 222 to calculate the difference between the read and write counters for the almost full and almost empty flags. The gray code is sent to address comparators 232 and 238 as well as to tri-state buffers 214 and 216. In gray code, one and only one bit changes between any two consecutive codes in the sequence. The purpose of registers 218 and 220 is to synchronize the read counter address in 210 to write clock signal and the purpose of registers 224 and 226 is to synchronize the write counter address to read clock signal for comparison purposes. Because there is no requirement that read clock signal 253 and write clock signal be synchronous, there is no guarantee that the outputs of 210 will not be changing during the setup and hold time windows of register 218. Because of the likelihood of change during the register setup and hold time window, there is a chance of an uncertain result. The chance of an uncertain result is limited by using gray code to make sure that only one bit can change at a time. However the uncertainty on that one bit resolves itself, the result is that the bit will either get the last address or the next address and no other address when comparing the read and write addresses.

When the memory is full writing must be inhibited to prevent overwriting valid data in the SRAM. To control this the comparison between the read and write addresses is done in the write clock (WCK) time domain since write operations are synchronous to WCK. The read address counter 210 gray code sampled two WCK cycles in the past by registers 218 and 220 is compared to the current write address counter 212 gray code by comparator 232. If the result is equal, then the SRAM may be full and writing is inhibited. There is no way to reliably know for certain if the SRAM is really full. The read address being compared is two WCK cycles old and one or more read operations may have occurred during that time. However, by erring on the side of safety when it is possible that the memory might be full, overwriting of data can be reliably prevented.

In a similar manner, when the memory is empty reading must be inhibited to prevent outputting invalid data from the SRAM. To control this the comparison between the write and read addresses is done in the RCK time domain since read operations are synchronous to RCK. The write address counter 212 gray code sampled two RCK cycles in the past by registers 224 and 226 is compared to the current read address counter 210 gray code by comparator 238. If the result is equal, then the SRAM may be empty and reading is inhibited. There is no way to reliably know for certain if the SRAM is really full. The write address being compared is two RCK cycles old and one or more read operations may have occurred during that time. However, by erring on the side of safety when it is possible that the memory might be empty, reading of invalid data can be reliably inhibited.

Since both a full and an empty condition are detected by equality between the read and write addresses, a way to tell the difference between the two conditions is require. This is accomplished by having an extra most significant bit (MSB) in counters 210 and 212 which is not part of the address space sent to the SRAM block (and not shown in FIG. 4 to avoid overcomplicating the disclosure and obscuring the invention). Additional logic (also not shown) inside each comparator 232 and 238 compares the read and write MSBs. When the two MSBs are equal and the read and write addresses are equal in comparator 238, this implies a possible empty condition. When the two MSBs are not equal and the read and write addresses are equal in comparator 232, this implies a possible full condition.

Figure 5:
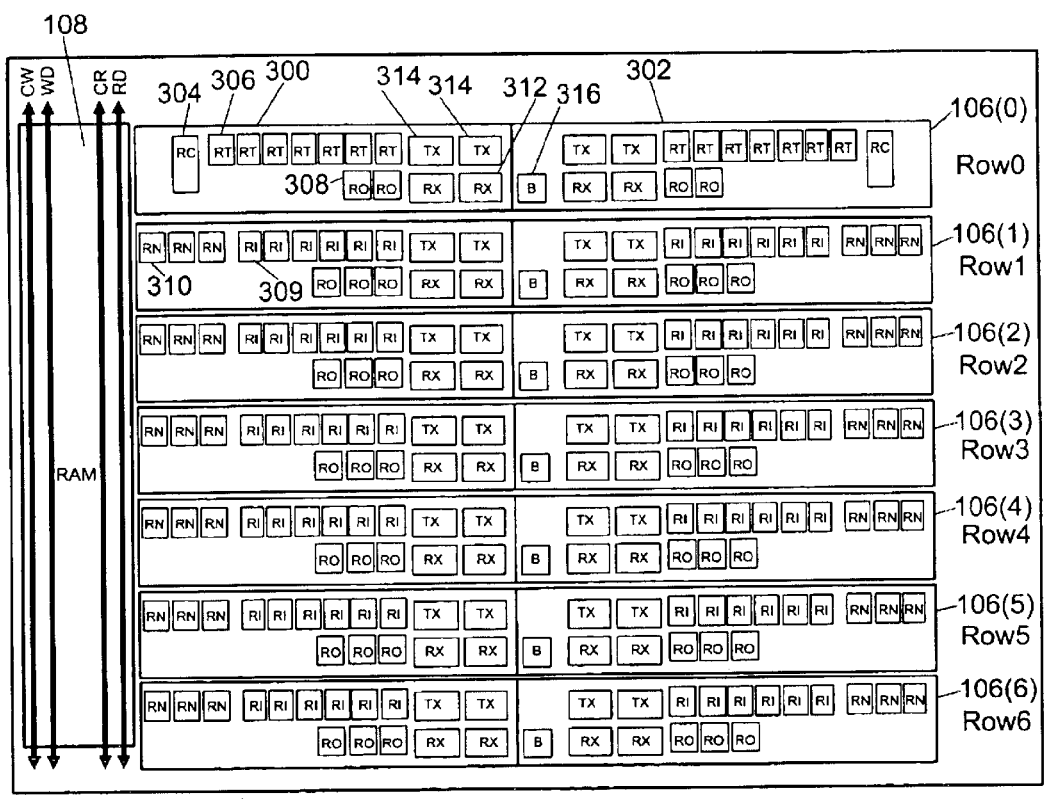
FIG. 5 is a simplified block diagram illustrating the architecture of a RAM cluster of the present system.

FIG. 5 is a simplified block diagram illustrating the architecture of a RAM cluster 106 of the present system. As would be clear to those of ordinary skill in the art having the benefit of this disclosure, RAM cluster 106 may comprise any number of the logic components as indicated below. The examples set forth below are for illustrative purposes only and in no way limit the scope of the present invention. Random access memory clusters 106(0–6) further comprise two sub-clusters 300 and 302. Each sub cluster 300 and 302 has two transmitter modules 314 and two receiver modules 312. Right sub cluster 302 has a buffer module 316.

To avoid overcomplicating the disclosure and thereby obscuring the present invention, receiver modules 312, transmitter modules 314 and buffer module 316 are not described in detail herein. The implementation of receiver modules 312 and transmitter modules 314 suitable for use according to the present system is disclosed in U. S. patent application Ser. No. 10/323,613, filed on Dec. 18, 2002, by inventor Arunangshu Kundu, William C. Plants, John McCollum and Venkatesh Narayanan, entitled "A ROUTING ARCHITECHTURE HAVING RECEIVERS AND TRANSMITTERS FOR A FIELD PROGRAMMABLE GATE ARRAY", having attorney docket number ACT-327, and hereby incorporated herein by reference. The implementation of buffer modules 316 suitable for use according to the present system is disclosed in U. S. patent application Ser. No. 10/293,895, filed on Nov. 12, 2002, by inventor William C. Plants, entitled "A FIELD PROGRAMMABLE GATE ARRAY ARCHITECHTURE INCLUDING A BUFFER MODULE AND A METHOD OF DISTRIBUTING BUFFER MODULES IN A FIELD PROGRAMMABLE GATE ARRAY", having attorney docket number ACT-337, and hereby incorporated herein by reference.

In the present example, for illustrative purposes only, the interface to each SRAM block 108 is logically one RAM cluster 106 wide and seven rows long. Thus, there is a column of seven RAM clusters 106(0) through 106(6) for every SRAM block 108. Sub-clusters 300 and 302 of RAM cluster 106(0) each have one RAM clock interface input (RC) module 304, six single ended input (RT) modules 306 and two RAM interface output (RO) modules 308 in addition to the two transmitter modules 314 and two receiver modules 312 as set forth above. Right sub cluster 302 also has a buffer module 316. RC modules 304 in RAM cluster 106(0) select the write and read clock signals from all the HCLK and RCLK networks or from signals in either of two adjacent two routed channels and determine their polarity. RC modules 304 will be discussed in greater detail below. Each RT module 306 provides a control signal to SRAM module 108 which is either routed from a single channel or tied off to logic 1 or logic 0. RO modules 308 transmit read-data or FIFO flags from SRAM module 108 into an individual output track. RT modules 306 and RO modules 308 will be discussed in greater detail below.

Sub-lusters 300 and 302 of RAM clusters 106(1–6) each have three two-input RAM channel-up/channel-down non-cascadable signal (RN) modules 310, three RO modules 308 and six two-input RAM channel-up/channel-down cascadable signal (RI) modules 309 in addition to the two transmitter modules 314 and two receiver modules 312 as set forth above. Right sub cluster 302 also has a buffer module 316. RN modules 310 and RI modules 309 provide an input signal to SRAM module 108 that can be routed from two rows, the one in which it is located and the row immediately above it.

Figure 6:
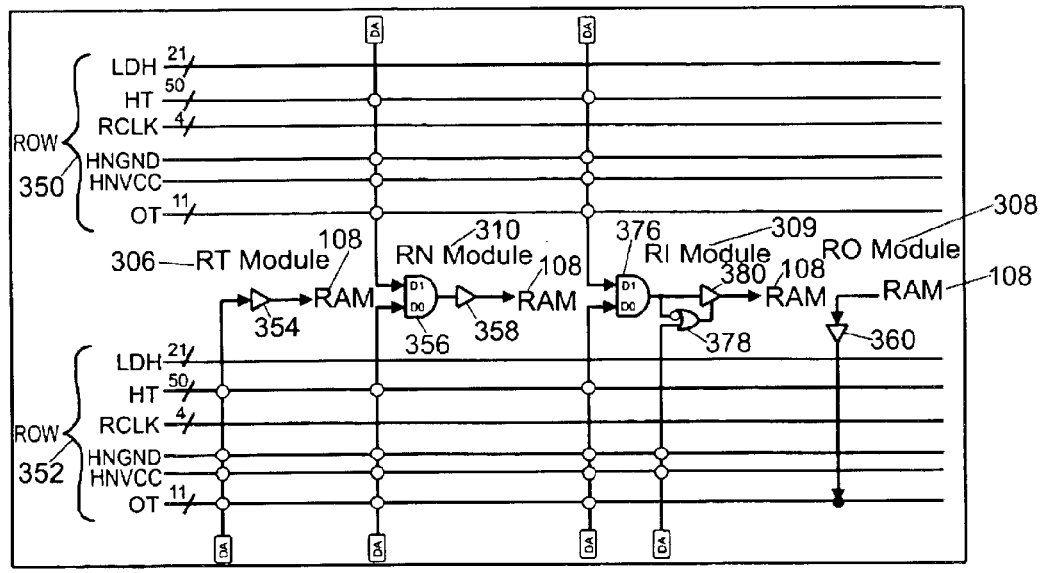
FIG. 6 is a simplified schematic diagram illustrating RT module, RN module, RI module and RO module of a RAM cluster of FIG. 5.

FIG. 6 is a simplified schematic diagram illustrating RT module 306, RN module 310, RI module 309 and RO module 308 of a RAM cluster of FIG. 5. RT module 306 comprises a buffer 354 that has an input programmably coupled to a horizontal routing track in routing architecture row 352. As is known to those of ordinary skill in the art, there are types of programmable elements. Illustrative examples of such programmable elements include, but are not limited to, MOS transistors, flash memory cell and antifuses. Buffer 354 has an output that is coupled to SRAM block 108.

RN module 310 comprises a two-input AND gate 356 and a buffer 358. One input of two-input AND gate 356 is programmably coupled to a horizontal routing track in routing architecture row 350. The second input of two-input AND gate 356 is programmably coupled to a horizontal routing track in routing architecture row 352. The output of two-input AND gate 356 is coupled to SRAM module 108 through buffer 358.

RI module 309 comprises a two-input NAND gate 376 having the ability to select a signal from routing architecture row 150 or 152. Two-input NAND gate 376 has an output coupled to SRAM block 108 through tri-state buffer 380 and one inverted signal input of a two-input OR gate 378. Two-input OR gate has a second input coupled to Vcc or ground and its output coupled to SRAM module 108 through tri-state buffer 380. In the present disclosure, Vcc is used to define the positive power supply for the digital circuit as designed. As one of ordinary skill in the art will readily recognize, the size of a digital circuit may vary greatly depending on a user's particular circuit requirements. Thus, Vcc may change depending on the size of the circuit elements used.

In this disclosure, various circuits and logical functions are described. It is to be understood that designations such as "1" and "0" in these descriptions are arbitrary logical designations. In a first implementation of the invention, "1" may correspond to a voltage high, while "0" corresponds to a voltage low or ground, while in a second implementation, "0" may correspond to a voltage high, while or "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

RO module 308 comprises a buffer 360 having an input coupled to FIFO control block 200 or SRAM block 108. The output of buffer 360 requires programming voltage protection and drives an output track which in routing architecture row 352.

Figure 7:
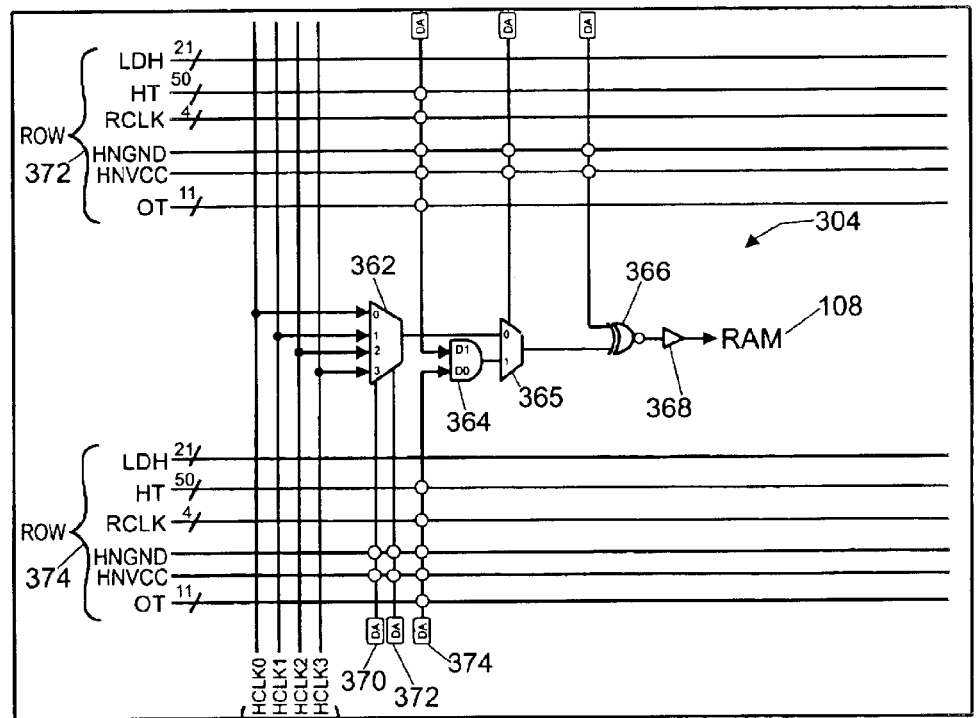
FIG. 7 is a simplified schematic diagram illustrating RC module of a ram cluster of FIG. 5.

FIG. 7 is a simplified schematic diagram illustrating RC module 304 of a ram cluster of FIG. 5. RC module 304 comprises a four input multiplexer 362 having inputs coupled to the clock network bus 370 (not shown). Multiplexer 362 has an output coupled to a first input of a two-input multiplexer 365. The second input of two-input multiplexer 365 is selectively programmably coupled to the routing architecture in rows 372 and 374 through two-input AND gate 364. Two-input multiplexer 365 has an output coupled to an input of a two-input XNOR gate that has a second input programmably coupled to Vcc ground in routing architecture row 372. The output of XNOR gate 366 is coupled to SRAM block 108 through buffer 368.

While embodiments and applications of this system have been shown and described, it would be apparent to those skilled in the art that many more modifications than mentioned above are possible without departing from the inventive concepts herein. The system, therefore, is not to be restricted except in the spirit of the appended claims.

What is claimed is:

1. A field programmable gate array comprising:
   a routing structure that transmits signals between components of said field programmable gate array;
   a plurality of random access memory clusters that store data;
   a plurality of static random access memory blocks that control transmission of data to and from said plurality of random access memory clusters wherein each of said plurality of random access memory clusters are coupled to one said plurality of static random access memory blocks; and
   a plurality of dedicated first-in/first-out memory logic components for providing first-in/first-out access to said data stored in said plurality of random access memory clusters wherein each of said plurality of plurality of dedicated first-in/first-out memory logic components is coupled to one of said plurality of static random access memory blocks and to each of said plurality of random access memory clusters coupled to said one of said plurality of static random access memory blocks.

2. The field programmable gate array of claim 1 wherein each of said plurality of dedicated first-in/first-out memory components comprises:
   a read circuit comprising:
      a first AND gate having inputs coupled to said plurality of random access memory cluster coupled to said one of said plurality of static random access memory blocks and an output coupled to a plurality of read registers in said one of said plurality of static random access memory blocks, and an address comparator, and
      an adder circuit having an input coupled to said output of said first AND gate and an output coupled to a magnitude comparator; and a write circuit comprising:

a second AND gate having inputs coupled to each of said random access memory clusters coupled to said one of said plurality of static random access memory blocks and an output coupled to a plurality of write registers of said one of said plurality of static random access memory blocks, and an address comparator; and an adder circuit having an input coupled to said output of said first AND gate through at least one of said plurality of write registers and an output coupled to a magnitude comparator.

3. The field programmable gate array according to claim 1 wherein each of said plurality of random access memory clusters comprises:

a plurality of logic components coupled to a synchronous random access memory module such that signals are sent and received between each of said plurality of random access memory clusters and said one of plurality of static random access memory block coupled to each of said plurality of random access memory clusters;

at least one transmitter;

at least one receiver;

at least one buffer; and an interconnect architecture coupling together said logic components, said at least one transmitter, said at least one receiver, and said at least one buffer.

4. The field programmable gate array according to claim 1 wherein said programmable elements comprise MOS transistors.

5. The field programmable gate array according to claim 1 wherein said programmable elements comprise flash memory cells.

6. The field programmable gate array according to claim 1 wherein said programmable elements comprise antifuses.

* * * * *